United States Patent
Cirillo (10) Patent No.: US 9,363,698 B2
(45) Date of Patent: Jun. 7, 2016

(54) METHOD AND A DEVICE FOR THE AUTOMATIC ALLOCATION OF A SIGNAL TO A MEASUREMENT APPLICATION

(75) Inventor: Luke Cirillo, Poing (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 14/238,732

(22) PCT Filed: Aug. 7, 2012

(86) PCT No.: PCT/EP2012/065399
§ 371 (c)(1),
(2), (4) Date: Aug. 11, 2014

(87) PCT Pub. No.: WO2013/023952
PCT Pub. Date: Feb. 21, 2013

(65) Prior Publication Data
US 2014/0370883 A1     Dec. 18, 2014

(30) Foreign Application Priority Data
Aug. 17, 2011 (DE) .......................... 10 2011 081 072

(51) Int. Cl.
*H04W 24/00* (2009.01)
*H04W 24/08* (2009.01)
(Continued)

(52) U.S. Cl.
CPC ............. *H04W 24/08* (2013.01); *G01R 13/029* (2013.01); *G01R 13/0263* (2013.01); *G01R 23/18* (2013.01)

(58) Field of Classification Search
CPC . H04W 24/08; G01R 13/0263; G01R 13/029; G01R 23/18

USPC ............ 455/422.1, 67.11, 450, 451; 370/203, 370/204, 208, 209, 238, 329, 438; 375/132, 375/260, 267, 269, 303, 344, 347
See application file for complete search history.

(56) References Cited

U.S. PATENT DOCUMENTS

| 5,852,630 A | * | 12/1998 | Langberg et al. ............. 375/219 |
| 8,995,502 B1 | * | 3/2015 | Lai et al. ...................... 375/219 |
| 2005/0032479 A1 | | 2/2005 | Miller et al. |

(Continued)

FOREIGN PATENT DOCUMENTS

| DE | 102009013617 A1 | 8/2010 |
| EP | 1699142 A1 | 9/2006 |

(Continued)

OTHER PUBLICATIONS

"International Preliminary Report on Patentability", PCT/EP2012/065399, Feb. 27, 2014.

(Continued)

*Primary Examiner* — Dhaval Patel
(74) *Attorney, Agent, or Firm* — Potomac Technology Law, LLC (57) ABSTRACT

At the start of a method for analyzing a communications signal with a frequency-mask trigger unit and a selection unit, a mask which describes a trigger range for the frequency-mask trigger unit is defined in the frequency domain, in frequency and amplitude. Furthermore, within the selection unit, an application is allocated to the mask. The frequency-mask trigger unit then checks whether the spectrum of the communications signal violates the mask. Finally, the signal component of the communications signal which violates the mask is transferred to the application for a further evaluation by the selection unit.

21 Claims, 8 Drawing Sheets

(51) Int. Cl.
*G01R 13/02* (2006.01)
*G01R 23/18* (2006.01)

(56) References Cited

U.S. PATENT DOCUMENTS

| | | | |
|---|---|---|---|
| 2009/0047920 A1 | 2/2009 | Livsics et al. | |
| 2010/0235124 A1 | 9/2010 | Tracy et al. | |
| 2011/0185059 A1 | 7/2011 | Adnani et al. | |
| 2012/0306886 A1* | 12/2012 | Bernard et al. | 345/440.1 |

FOREIGN PATENT DOCUMENTS

| | | |
|---|---|---|
| EP | 1884876 A2 | 2/2008 |
| EP | 2071341 A2 | 6/2009 |
| EP | 2219037 A2 | 8/2010 |
| WO | WO2008010608 A2 | 1/2008 |

OTHER PUBLICATIONS

"Software Defined Radio Testing Using Real-Time Signal Analysis", Tektronix Application Note, 37W-19680-0, Aug. 2006.
"Testing Modern Radios", Tektronix Application Note, 37W-21488-1, Jun. 2008.
Da Silva, Marcus, "Trigger-Capture-Analyze: Three Steps Toward Understanding Today's Complex RF Signals", Microwave Journal, Mar. 2001, Mar. 2004, pp. 22, 24, 26, 28, 30, 32, 34, 36.
Xiao, Yan et al., "A New Signal Capture Method Based on Real-Time Multi-Domain Trigger in Communication Analyzer", 978-1-4244-2587-7, IEEE, 2009.

* cited by examiner

METHOD AND A DEVICE FOR THE AUTOMATIC ALLOCATION OF A SIGNAL TO A MEASUREMENT APPLICATION

CROSS-REFERENCE TO RELATED APPLICATION(S)

The present application is a national phase application of PCT application No. PCT/EP2012/065399, filed Aug. 7, 2012, and claims priority to German Patent Application No. DE 102011081072.2, filed Aug. 17, 2011, the entire contents of which are incorporated herein by reference.

FIELD

The invention relates to a method and a device for the automatic allocation of at least one signal component of a communications signal to at least one measurement application or to at least one measurement function on the basis of measured signal properties.

BACKGROUND

A number of communications standards are currently available for wireless communications links. In order to keep development costs for the various component groups as low as possible, efforts are made to cover as many communications standards as possible with the smallest possible number of component groups. For example, the most recent base stations for mobile terminal devices, not only operate the Global System for Mobile Communications (GSM) standard but also transmit and receive, for instance, in the frequency range for Universal Mobile Telecommunications System (UMTS) or Long Term Evolution (LTE). Such base stations generate so-called multi-standard radio signals. The development and above all the testing of universal component groups within a base station which uses different communications standards at the same time can be difficult and time-consuming. Often, only the spectral characteristics are measured in one test scenario, and these are used to determine whether the corresponding communications standard has been fulfilled or not.

A method and a device for the operation of a frequency-mask trigger unit is known from EP 2071341 A2. Starting from the spectral characteristic of a signal to be measured, an upper and a lower mask are generated with a spacing distance from the latter. If a signal to be measured overshoots the upper mask and/or the lower mask, an alarm can be triggered. The disadvantage with EP 2071341 A2 is that an automatic analysis of the signal which violates the mask is not possible.

What is needed, therefore, is to provide a solution for the detailed analysis of a communications signal dependent upon its spectral characteristic.

SUMMARY

Embodiments of the present invention advantageously address the foregoing requirements and needs, as well as others, by providing a method and a device for the automatic allocation of signal component(s) of a communications signal to measurement application(s) or measurement function(s) on the basis of measured signal properties, achieving a detailed analysis of a communications signal dependent upon its spectral characteristics.

According to an example embodiment of the present invention, a method for analyzing a communications signal comprising a frequency-mask trigger unit and a selection unit provides several method steps. In a first method step, at least one mask which describes a trigger range for a frequency-mask trigger unit is defined in the frequency domain, in frequency and amplitude. In a further method step, at least one application is allocated to the at least one mask within the selection unit. In a subsequent method step, a check is carried out to determine whether the spectrum of the communications signal violates the at least one mask. Finally, in a further method step, at least one signal component of the communications signal which violates the at least one mask is transferred to the at least one application for a further evaluation.

In the case of such methods according to example embodiments of the present invention, it is advantageous that several masks can be defined arbitrarily and that each mask can be linked to an application to which the signal component, which is disposed within the mask and violates the latter, can be transmitted. This allows especially communications signals which are multi-standard radio signals to be evaluated in a fully automated manner. If, for example, a GSM signal and an UMTS signal are present within the communications signal, it can be ensured by defining different masks for the corresponding frequency range, that any occurring GSM signal is evaluated by an application which is suitable for the evaluation of GSM signals, whereas, with the occurrence of an UMTS signal in another frequency range, a different application suitable for the evaluation of UMTS signals is selected.

According to an example embodiment of the present invention, a device comprises a frequency-mask trigger unit and a selection unit, wherein, using an input unit, at least one mask, which describes a trigger range for a frequency-mask trigger unit, can be defined in the frequency domain, in frequency and amplitude. Moreover, using the selection unit, at least one application can be allocated to the at least one mask. With this frequency-mask trigger unit, it is therefore possible to check whether the spectrum of the communications signal violates the at least one mask, whereas at least one signal component of the communications signal which violates the at least one mask can be transferred via the selection unit to the at least one application for a further evaluation.

In the case of such devices according to example embodiments of the present invention, it is advantageous that several masks can be defined within the device for analyzing a communications signal, whereas at least one application can be linked to each mask. Accordingly, as soon as a violation of a mask is determined by the frequency-mask trigger unit, the signal component which violates the mask can be transmitted to the application stored for the mask, in order to be evaluated by the latter. In this context, the masks can be distributed over different frequency ranges which are reserved for different communications standards. As soon as a mask is violated, it is automatically known which communications standard is involved, and the corresponding signal component can be transmitted directly to the appropriate application for further evaluation. This allows a communications signal which contains several communications standards to be evaluated in real-time.

A further advantage of methods according to example embodiments of the invention is achieved where the at least one signal component of the communications signal can be filtered with a bandpass filter, whereas the bandwidth of the bandpass filter corresponds to the width of the violated mask, and whereas the central frequency of the bandpass filter corresponds to the frequency in the middle of the mask. By way of example, in the case of communications signals which are multi-standard radio signals, this allows signal components from other communications standards to be filtered out. For example, if a GSM signal and a UMTS signal are present in the communications signal, the UMTS signal can be filtered out with the bandpass filter when the signal component violates a mask which covers the frequency range for a GSM signal. Moreover, the at least one signal component of the communications signal is mixed into the baseband and then transferred to an application. For the mixing procedure, the already-known central frequency which corresponds to the frequency in the middle of the mask can be used. Only the signal component of the communications signal to be analyzed is then provided to the at least one application.

Further advantages are achieved with methods according to example embodiments of the invention, where the communications signal is filtered in succession, with a bandpass filter for every frequency range of the masks violated, wherein the bandwidth of the bandpass filter corresponds to the bandwidth of the respective violated mask, and whereas the central frequency of the bandpass corresponds to the frequency in the middle of the respective mask, and/or if the respective signal component of the communications signal is mixed into the baseband in order to transfer the respective signal component of the communications signal mixed into the baseband to the respective application. By way of example, such advantages are achieved when different signal components within the communications signal violate different masks at the same time. In this case, initially, the first signal component which violates a first mask is filtered with a corresponding bandpass filter and mixed into the baseband, whereas, only after this, a second signal component which violates a further mask is filtered with a further bandpass filter and then mixed in a further mixing process into the baseband and transmitted to the corresponding application. In the case of a communications signal which contains, for example, a GSM signal and a UMTS signal, this ensures that the GSM signal is freed from the UMTS signal, so that the former is supplied only to an application for the evaluation of the GSM signal. The same applies to the application which is used for the evaluation of a UMTS signal.

With methods according to example embodiments of the invention, an advantage is also achieved if all occurring signal components of the communications signal which violate a mask are buffered or marked whenever the evaluation of the at least one signal component by at least one application suggests an error. For example, if a GSM signal within the communications signal which also contains a UMTS signal and/or an LTE signal does not correspond to the underlying standard, the error may optionally also be sought in another active channel. For this reason, it is further advantageous to determine that, optionally at the time at which the error has been detected, other masks have been violated, or respectively that the communications signal contains signal components of other communications standards.

With regard to devices according to example embodiments of the invention, an advantage is achieved where the input unit is configured to define different ranges within the at least one mask in the frequency domain, in frequency and amplitude, and where the selection unit is configured to allocate different ranges to at least one application respectively, and/or to at least one measurement function within each application, and where the device is configured to transmit the at least one signal component of the communications signal which violates the at least one mask to the at least one application which is allocated to the corresponding frequency range in which the mask is violated, and/or to the at least one measurement function within an application which is allocated to the corresponding range in which the mask is violated. It is further advantageous where a mask is subdivided into further ranges and if every range can be linked to a different application or to a different measurement function within an application. This allows the definition of ranges within a mask, which, if they are violated, can indicate that the rise in the spectrum for a signal component does not correspond to the standard, so that a special measurement function is opened in order to analyze this factual situation in greater detail, whereas another range can be defined in such a manner that, if it is violated, there is a risk that the signal provides an excessively high amplitude, so that another measurement function or another application is executed. This means that the signal component which violates the mask need not be analyzed with all of the available applications, but, with regard to the spectral form, it may be sufficient if individual applications or individual measurement functions within an application perform the analysis. The results obtained in this context are sufficiently predictive to determine whether the signal component of the communications signal is in conformity with the standard or not.

Furthermore, with devices according to example embodiments of the invention, it is advantageous where, in the case of an overlapping of several ranges and/or several masks, the device is configured to select the range and/or the mask where a power peak of the communications signal is highest, or where an average power of the communications signal is highest, or where a priority of the allocated application and/or measurement function is highest. This ensures that it is not necessary to execute all of the applications and/or measurement functions within an application which are linked to the corresponding range and/or the corresponding mask. Accordingly, the calculation time can be further reduced, whereas, however, it can be securely determined whether the signal component is a standard component of the communications signal or not.

Devices according to example embodiments of the invention provide further advantages where the mask represents an area in the spectrum, or where a mask is violated whenever a measured value of the communications signal transformed into the frequency domain is disposed in the area, and/or where the communications signal is a multi-standard radio signal, and/or where different frequency ranges for different communications standards can be covered by different masks, and/or where different measurements for the different communications standards can be implemented with different applications, and where the EVM of at least one communications standard can be determined by an application in the case of a violated mask, and/or where it is possible, in the case of a high value for the EVM, to buffer which further masks are additionally violated, and/or where the values for the sampled communications signal can be buffered continuously in a ring buffer, and/or where the communications signal to be analyzed can be displayed in a spectrogram. It is further advantageous if the communications signal to be analyzed can be displayed in a spectrogram because, within the latter, it is possible to select the length of the time range before or after the violation of a mask and/or of a range of the signal component which is transmitted to the corresponding application.

BRIEF DESCRIPTION OF THE DRAWINGS

By way of example, various exemplary embodiments of the invention are described below with reference to the drawings. Identical subject matters provide the same reference numbers. In detail, the corresponding figures of the drawings are as follows.

DETAILED DESCRIPTION

Figure 1:
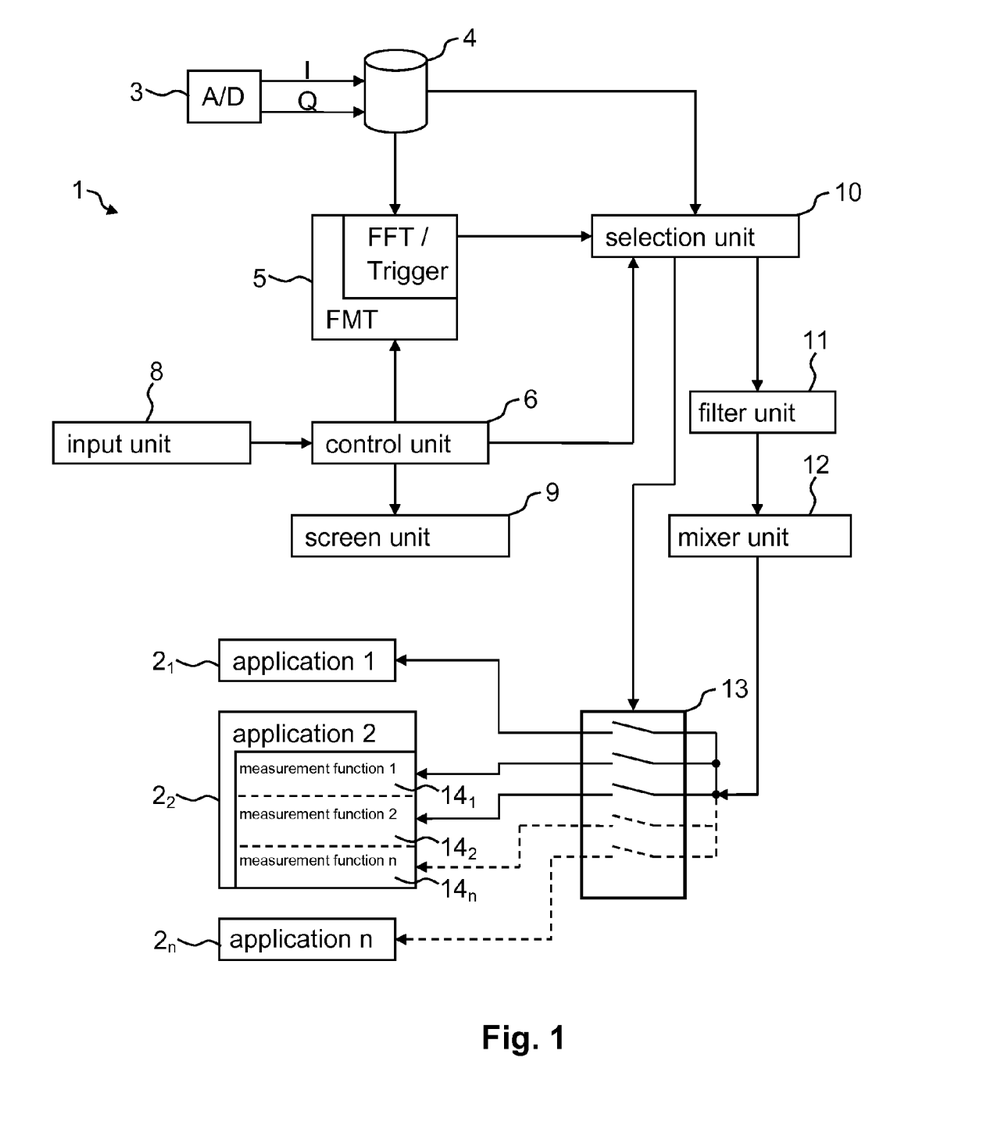
FIG. 1 a block-circuit diagram, which illustrates the device for the allocation of a signal component to at least one application according to example embodiments of the invention.

FIG. 1 shows a block-circuit diagram, which illustrates the device 1 for the allocation of a signal component to at least one application $2_1$, $2_2$ to $2_n$, where n>2, according to example embodiments of the invention. The device 1 according to the invention can be, for example, a spectrum analyzer. By means of an analog/digital converter 3, a communications signal can be digitized, whereas the digitized communications signal is buffered in the storage unit 4. The storage unit 4 is preferably a ring buffer which allows a high data throughput. In the exemplary embodiment from FIG. 1, the I-component and the Q-component of the communications signal are each buffered in the storage unit 4.

The storage unit 4 is further connected to a frequency-mask trigger unit 5. The frequency-mask trigger unit 5 continuously transforms the communications signal disposed in the ring buffer 4 into the frequency domain. For this purpose, a corresponding transformation unit is embodied in the frequency-mask trigger unit 5. The transformation unit is preferably a Fast-Fourier Transform unit. The frequency-mask trigger unit 5 also provides a trigger, which compares whether the amplitude of the individual bins exceeds a previously specified threshold value.

The frequency-mask trigger unit 5 is also connected to the control unit 6. Via the control unit 6, the trigger threshold can be communicated to the frequency-mask trigger unit 5. The trigger threshold can relate to one or more frequency ranges of given amplitude. These so-called trigger thresholds are also described as masks 7, $7_1$, $7_2$, $7_3$. Such a mask 7, $7_1$, $7_2$, $7_3$ can be a complex two-dimensional structure, which surrounds a given spectrum in frequency and amplitude. A precise method of functioning of these masks 7, $7_1$, $7_2$, $7_3$ will be explained in greater detail below. Within the control unit 6, which is connected to the frequency-mask trigger unit 5, different masks 7, $7_1$, $7_2$, $7_3$ for different communications standards, such as GSM, UMTS or LTE are buffered.

Moreover, the control unit 6 is connected to an input unit 8. Further masks 7, $7_1$, $7_2$, $7_3$, which are transmitted to the control unit 6, and via the control unit 6 to the frequency-mask trigger unit 5, can be defined via the input unit 8. In the simplest case, the input unit 8 can comprise operating elements on the housing of the device by means of which the user can define an appropriate mask 7, $7_1$, $7_2$, $7_3$. However, the input unit 8 can also comprise additional ports, such as a network interface and/or USB port, by means of which further, previously defined masks 7, $7_1$, $7_2$, $7_3$ can be loaded from another computer system.

Furthermore, a screen unit 9 is connected to the control unit 6. The control unit 6 receives from the frequency-mask trigger unit 5, for example, the communications signal transformed into the frequency domain, and displays the latter on the screen unit 9. The different masks 7, $7_1$, $7_2$, $7_3$ can also be displayed on the screen unit 9 at the same time. The frequency-mask trigger unit 5 also notifies the selection unit 10 which of the masks 7, $7_1$, $7_2$, $7_3$ defined by the control unit 6, which have been opened within the spectrum, have been violated by the communications signal 20 transformed into the frequency domain. The control unit 6 also notifies the selection unit 10 regarding the application $2_1$, $2_2$ to $2_n$ to which the signal component $20_1$, $20_2$ in the communications signal 20, which violates the corresponding mask 7, $7_1$, $7_2$, $7_3$, should be transmitted.

If the selection unit 10 receives a trigger impulse from the frequency-mask trigger unit 5, it transfers the buffered communications signal to the filter unit 11. The filter unit 11 filters the at least one signal component $20_1$, $20_2$ of the communications signal 20 with a bandpass filter, whereas the bandwidth of the bandpass filter corresponds to the width of the violated mask 7, $7_1$, $7_2$, $7_3$ and whereas the central frequency of the bandpass filter corresponds to the frequency in the middle of the mask 7, $7_1$, $7_2$, $7_3$. In this context, the corresponding bandpass filter within the filter unit 11 is configured by the selection unit 10 for the signal component $20_1$, $20_2$ within the communications signal 20, which has violated the mask 7, $7_1$, $7_2$, $7_3$ and caused the frequency-mask trigger unit 5 to output a trigger impulse.

The filtered communications signal is then supplied to a mixer unit 12. The mixer unit 12 mixes into the baseband at least the signal component $20_1$, $20_2$ of the communications signal 20 which has violated the at least one mask 7, $7_1$, $7_2$, $7_3$ or respectively the signal component which extends over the same frequency as the violated mask 7, $7_1$, $7_2$, $7_3$. An additional filter unit which filters out any mirror frequencies can also be connected following the mixer unit 12.

Moreover, the mixer unit 12 is connected to a switch unit 13, whereas the switch unit 13 is also connected to the selection unit 10. The selection unit 10 controls the switch unit 13 in such a manner that the signal component of the communications signal mixed into the baseband is transferred to the required application $2_1$, $2_2$ to $2_n$. The information regarding which signal component $20_1$, $20_2$ should be transferred to which application $2_1$, $2_2$ to $2_n$ is received by the selection unit 10 from the control unit 6. The corresponding signal components $20_1$, $20_2$ are the components of the communications signal 20 which violate a previously defined mask 7, $7_1$, $7_2$, $7_3$. It is also possible for the signal components $20_1$, $20_2$ of the communications signal 20 which have been mixed into the baseband not to be transferred as a whole to one application $2_1$, $2_2$ to $2_n$, but to be transmitted directly to individual measurement functions $14_1$, $14_2$ to $14_n$ within an application $2_1$, $2_2$ to $2_n$.

In this manner, the communications signal 20 which is generated, for example, by a base station in development, can be analyzed continuously. Accordingly, the communications signal 20 is constantly transformed by the frequency-mask trigger unit 5 into the frequency domain, whereas the amplitude of the communications signal 20 transformed into the frequency domain is continuously compared with previously defined masks 7, $7_1$, $7_2$, $7_3$. In the case of an overshooting of a threshold value, a trigger event, which is transmitted to the selection unit 10, is automatically released. The selection unit 10 then, once again, buffers the communications signal 20 disposed in the ring buffer unit 4, or respectively copies the latter and supplies it to a filter unit 11, which is configured according to the violated mask 7, $7_1$, $7_2$, $7_3$. Following this, the at least one signal component $20_1$, $20_2$ of the communications signal 20 is mixed via the mixer unit 12 into the baseband and transferred via a corresponding position of the switch unit 13 to the required application $2_1$, $2_2$ to $2_n$ or respectively to the required measurement function $14_1$, $14_2$ to $14_n$ within the corresponding application $2_1$, $2_2$ to $2_n$.

All of the connections are functional connections, which can be realized, for example, by electrical connections. The entire device 1, with the exception of the input unit 8 and the screen unit 9, can be realized within field programmable gate array (FPGA).

Figure 2:
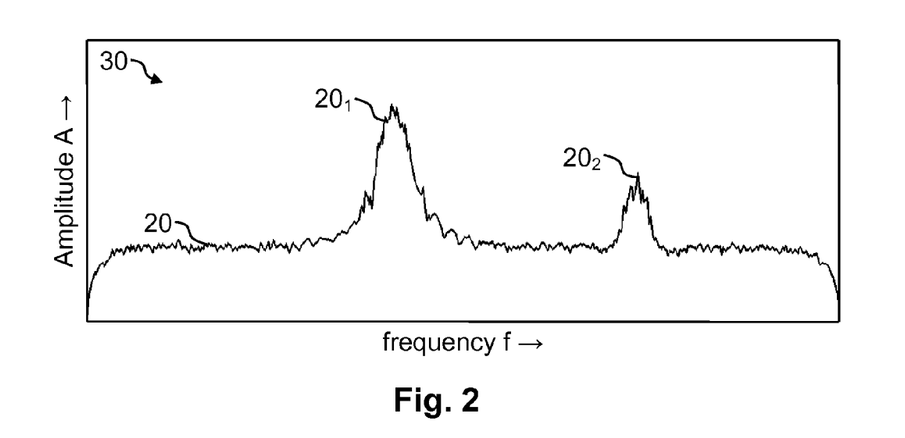
FIG. 2 a diagram that illustrates a spectral characteristic of the communications signal.

FIG. 2 shows a diagram that illustrates a spectral characteristic of the communications signal 20. Such a spectral characteristic of the communications signal 20 can be generated by the Fast-Fourier Transform unit within the frequency-mask trigger unit 5 by transforming the communications signal 20 buffered in the ring buffer unit 4 into the frequency domain, in order then, to be transmitted by means of the control unit 6 to the screen unit 9. The communications signal 20 in FIG. 2 is a multi-standard radio signal, which is generated, for example, by a base station in development. The frequency is plotted on the abscissa, and the amplitude is plotted on the ordinate. It is evident that the communications signal 20 provides two peaks $20_1$, $20_2$. The first peak $20_1$ can be, for example, a GSM signal. The second peak $20_2$ can be, for example, a UMTS signal. Other peaks can also occur, which represent different signals from different communications standards. In the further course, the peaks $20_1$, $20_2$ of the communications signal 20 are also referred to as signal components $20_1$, $20_2$ of the communications signal 20, because it is assumed that payload information is transmitted in these signal components.

Figure 3A:
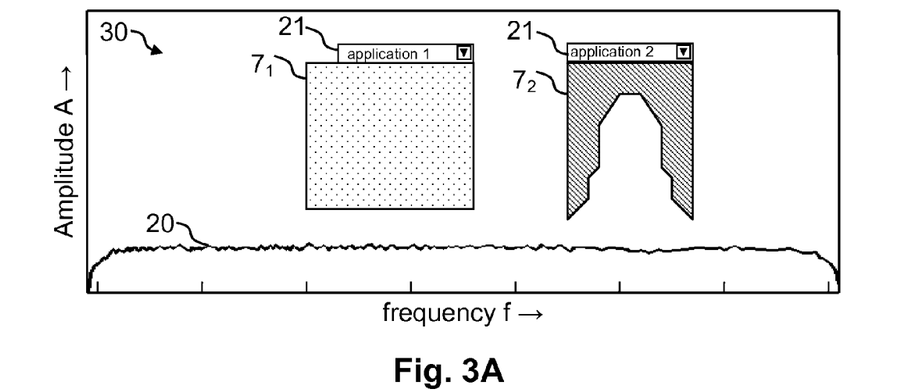
FIG. 3A a diagram that illustrates the definition of different masks within a spectrum according to example embodiments of the invention.

FIG. 3A shows a diagram that illustrates the definition of different masks 7, $7_1$, $7_2$, $7_3$ in a spectrum 30 according to example embodiments of the invention. It is evident in the exemplary embodiment from FIG. 3A that the communications signal 20 consists exclusively of a noise and contains no signal components $20_1$, $20_2$ capable of being evaluated. Furthermore, in the exemplary embodiment from FIG. 3A, two masks $7_1$, $7_2$ are defined. The first mask $7_1$ is defined as a simple rectangle. Such a mask $7_1$ can be generated by inputting the start frequency and the end frequency together with a minimum and maximum amplitude. If the screen unit 9 is a touch-sensitive screen unit, such a mask $7_1$ can also be opened on the touch screen unit 9 via a spreading movement, for example, between the thumb and index finger. The mask $7_1$ can be moved without difficulty over the screen unit, whereas this functions in a particularly simple manner if the screen unit 9 is a touch-sensitive screen unit 9. A selection menu 21 is also assigned to the mask $7_1$. Within the selection menu 21, one or more stored applications $2_1$, $2_2$ to $2_n$ and/or measurement functions $14_1$, $14_2$ to $14_n$ within the individual applications $2_1$, $2_2$ to $2_n$ can be linked to the mask $7_1$.

Similarly, in the exemplary embodiment from FIG. 3A, a second mask $7_2$ is also displayed on the screen unit 9. The geometry of this second mask $7_2$ is more complex than the geometry of the first mask $7_1$. Accordingly, the geometry of the second mask $7_2$ is adapted to a characteristic of a signal component $20_1$, $20_2$ to be measured of the communications signal 20. A selection menu 21 is also displayed in connection with the mask $7_2$. In the selection menu 21 for the second mask $7_2$, a different application $2_1$, $2_2$ to $2_n$ is linked to the mask $7_2$ by comparison with that linked to the mask $7_1$.

It is evident that both masks $7_1$, $7_2$ provide a different hatching in order to distinguish them from one another and from the communications signal 20. In addition to a different hatching, different color tones can also be used, whereas the two masks $7_1$, $7_2$ are preferably displayed as transparent. Both masks $7_1$, $7_2$ also differ with regard to their use. The first mask $7_1$ is, in principle, always violated when the communications signal 20 generally provides a signal component $20_1$, $20_2$ in the corresponding frequency range, whereas the second mask $7_2$ can only be violated, if the corresponding signal component $20_1$, $20_2$ deviates from the shape defined in the standard. The first mask $7_1$ is therefore preferably used in order to register every signal component $20_1$, $20_2$ occurring and to cause it to be evaluated by an application $2_1$, $2_2$ to $2_n$, whereas the second mask $7_2$ is only used in order to cause a signal component $20_1$, $20_2$ to be evaluated by an application $2_1$, $2_2$ to $2_n$, if this signal component $20_1$, $20_2$ does not correspond to the shape specified by the standard.

Figure 3B:
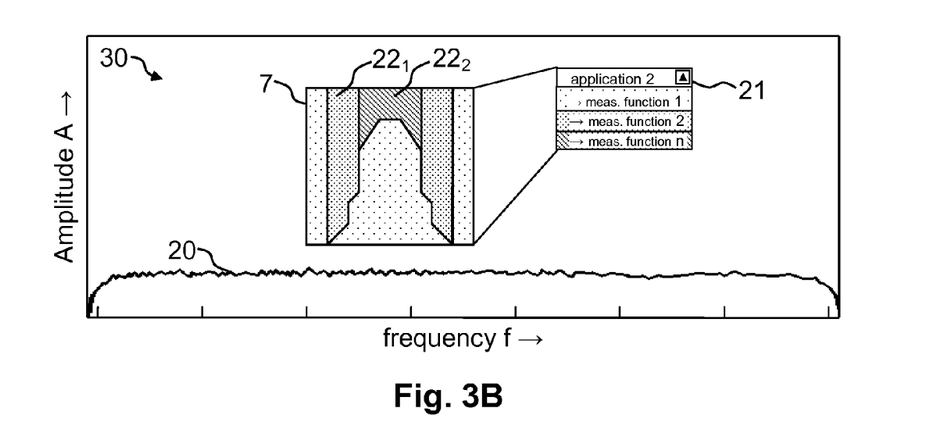
FIG. 3B a diagram that illustrates the definition of different ranges within a mask within a spectrum according to example embodiments of the invention.

FIG. 3B shows a diagram that illustrates the definition of different ranges $22_1$, $22_2$ within a mask 7 via a spectrum 30 according to example embodiments of the invention. It is evident that, once again, a mask 7 which occupies a rectangular area is opened. Two ranges $22_1$, $22_2$ are also defined in the mask 7. The ranges $22_1$, $22_2$ are defined exactly as in the masks 7, $7_1$, $7_2$, $7_3$, whereas the ranges $22_1$, $22_2$ in this case must not enclose any areas in the spectrum 30 on which there is no mask 7, $7_1$, $7_2$, $7_3$. The maximum size of a range $22_1$, $22_2$ can therefore only be as large as the underlying mask 7, $7_1$, $7_2$, $7_3$; the ranges $22_1$, $22_2$ can thus only be defined within masks 7, $7_1$, $7_2$, $7_3$. It is evident that the ranges $22_1$, $22_2$ in the exemplary embodiment from FIG. 3B are adapted to a possible shape of a signal component $20_1$, $20_2$ of the communications signal 20. Via the selection menu 21, it is possible to specify, for the mask 7 and also for the two ranges $22_1$ and $22_2$, which applications $2_1$, $2_2$ to $2_n$ or which measurement functions $14_1$, $14_2$ to $14_n$ should be executed if the mask 7 and/or the corresponding ranges $22_1$, $22_2$ are violated by a signal component $20_1$, $20_2$ of the communications signal 20. The applications $2_1$, $2_2$ to $2_n$ allocated within the selection menu 21 to the different ranges $22_1$, $22_2$ and/or to the mask 7 and/or the measurement functions $14_1$, $14_2$ to $14_n$ provide the same hatching and/or color, so that it is possible to establish very simply which application $2_1$, $2_2$ to $2_n$ and/or which measurement function $14_1$, $14_2$ to $14_n$ is linked to which mask 7 and/or to which range $22_1$, $22_2$.

Every mask $7, 7_1, 7_2, 7_3$ and/or every range $22_1, 22_2$ within a mask $7, 7_1, 7_2, 7_3$ can be linked to one or more applications $2_1, 2_2$ to $2_n$ and/or to one or more measurement functions $14_1, 14_2$ to $14_n$.

If a signal component $20_1, 20_2$ of the communications signal 20 violates the mask 7, but not the two ranges $22_1, 22_2$, only the measurement function 1 $14_1$ is executed within the application $2_2$. Such a measurement function $14_1$ can, for example, demodulate the payload data transmitted, whereas, in the case of a violation of one of the two ranges $22_1, 22_2$, for example, the error vector magnitude (EVM) and/or complementary cumulative distribution function (CCDF) of the signal component $20_1, 20_2$ of the communications signal 20 is calculated by means of the further measurement functions $14_2$ to $14_n$.

Figure 3C:
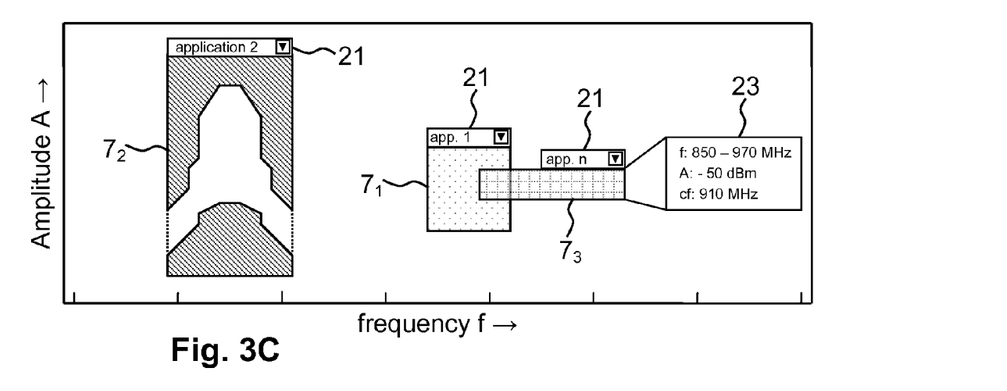
FIG. 3C a diagram that illustrates the definition of further types of masks via the spectrum according to example embodiments of the invention.

FIG. 3C shows a diagram that illustrates the definition of further types of masks $7, 7_1, 7_2, 7_3$ according to example embodiments of the invention. The mask $7_2$ in this context comprises two parts which are separate from one another. A first or upper part of the mask $7_2$ describes an upper limit value and a second part of the mask $7_2$ describes a lower limit value. In the exemplary embodiment from FIG. 3C, both parts of the mask $7_2$ are linked to the same application $2_2$. A signal component $20_1, 20_2$ which is disposed within the mask $7_2$ is only analyzed by the application $2_2$ if it does not fall within the specified template, that is, if it violates either the first part, and therefore the upper limit value, and/or the second part, and therefore the lower limit value, of the mask $7_2$. However, it is also possible for both parts of the mask $7_2$ to be analyzed by different applications $2_1, 2_2$ to $2_n$ and/or measurement functions $14_1, 14_2$ to $14_n$ within the applications $2_1, 2_2$ to $2_n$. A mask $7, 7_1, 7_2, 7_3$ can therefore comprise a random number of individual parts, which need not necessarily touch one another.

Furthermore, FIG. 3C shows two further masks $7_1, 7_3$. For improved differentiation, all of the masks $7_1, 7_2, 7_3$ are displayed with different hatching and/or color tones. The peculiarity here is that the masks $7_1$ and $7_3$ can also overlap. In this context, the mask $7_1$ is linked to the application $2_1$ and the mask $7_3$ to the application $2_n$. For every mask $7_1, 7_2$ and $7_3$, an information menu 23 can be displayed on the screen unit 9, as shown for the mask $7_3$ in FIG. 3C. The information menu 23 shows information about the start frequency and the end frequency. In this case, the start frequency is 850 MHz and the end frequency is 970 MHz. Information about the trigger threshold is also specified in the information menu 23. Accordingly, within the frequency-mask trigger unit 5, a trigger signal is generated if a signal component $20_1, 20_2$ within the frequency range from 850 MHz to 970 MHz reaches or exceeds an amplitude of −50 dBm. The central frequency (English: central frequency) is also automatically specified. In this example, this amounts to 910 MHz. As already explained, the central frequency is important for the adjustment of the bandpass filter in the filter unit 11.

Moreover, it is used in the mixer unit 12 in order to mix the signal component $20_1, 20_2$ into the baseband. If a signal component $20_1, 20_2$ of the communications signal 20 violates both masks $7_1, 7_3$ at the same time, the bandpass filter in the filter unit 11 is preferably first adjusted to the central frequency of the mask $7_1$ in order to filter the signal component $20_1, 20_2$ of the communications signal 20 and then to mix the latter into the baseband and to transfer it to the application $2_1$. Following this, the bandpass filter in the filter unit 11 is adjusted to the central frequency of the mask $7_3$, so that the signal component $20_1, 20_2$ of the communications signal 20 is filtered appropriately and then mixed by the mixer unit 12 into the baseband and transferred to the application $2_n$. If two or more filter units 11 and mixer units 12 are available, the corresponding signal component $20_1, 20_2$ of the communications signal 20 can also be filtered, mixed and transferred to the applications $20_1, 20_2$ at the same time, by transferring the communications signal 20 separately to every filter unit 11.

Figure 3D:
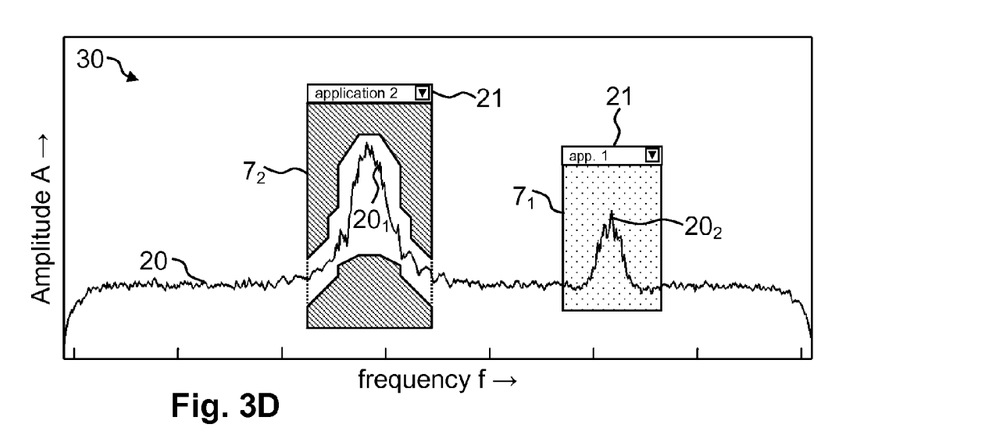
FIG. 3D a diagram that illustrates the violation of a mask by the communications signal according to example embodiments of the invention.

FIG. 3D shows a diagram that illustrates the violation of a mask $7_1$ by the communications signal 20 according to example embodiments of the invention. The communications signal 20 once again provides two signal components $20_1, 20_2$, which project above the noise as peaks. The mask $7_2$, which comprises two parts and is known from FIG. 3C, is arranged in the frequency range in which the signal component $20_1$ is expected. The mask $7_1$, which covers a rectangular area, is embodied in the range in which the signal component $20_2$ is expected.

It is clearly evident that the signal component $20_1$ does not violate the mask $7_2$, which comprises two parts. The signal component $20_1$ of the communications signal 20 is therefore not transferred to the application $2_2$, which is linked to the mask $7_2$. By contrast, the situation with the signal component $20_2$ of the communications signal 20 is different. This signal component $20_2$ violates the mask $7_1$. Accordingly, the frequency-mask trigger unit 5 triggers a trigger impulse, which is transferred to the selection unit 10. The selection unit 10 preferably buffers the I-component and the Q-component of the communications signal 20 stored in the ring buffer 4 and filters the communications signal 20 by means of a filter unit 11, in which a bandpass filter, of which the central frequency corresponds to the middle of the mask $7_1$, is realized. The bandwidth of this bandpass filter in the filter unit 11 corresponds to the width of the violated mask $7_1$. Furthermore, the filtered communications signal 20 is supplied to the mixer unit 12. The mixer unit 12, to which the central frequency is also known, mixes the at least one signal component $20_2$ down into the baseband. The selection unit 10 controls the switch unit 13 in such a manner that the at least one signal component $20_2$ mixed down into the baseband can be transmitted to the application $2_1$. The application $2_1$ can, for example, demodulate the signal.

Figure 3E:
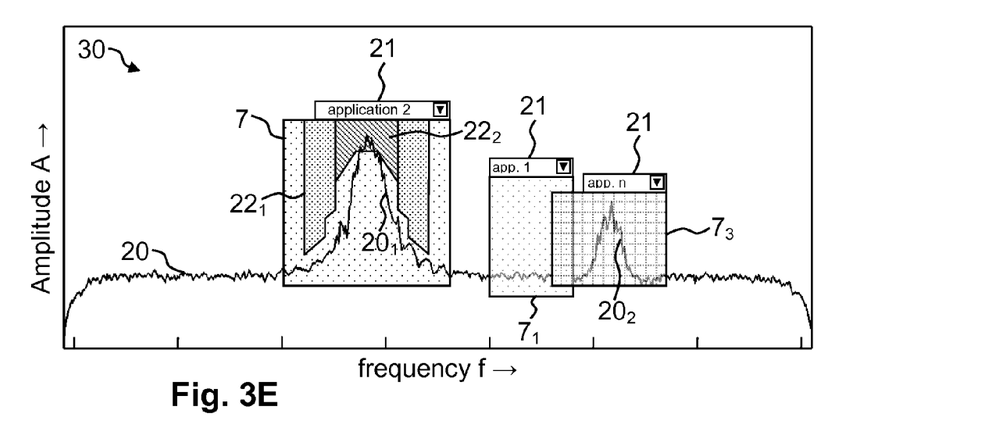
FIG. 3E a diagram that illustrates the violation of a plurality of masks by the communications signal according to example embodiments of the invention.

FIG. 3E shows a diagram that illustrates the violation of a plurality of masks $7, 7_1, 7_2, 7_3$ by the communications signal 20 according to example embodiments of the invention. In this context, a first signal component $20_1$ of the communications signal 20 violates the mask 7 and the range $22_2$ opened within the mask 7. The range $22_1$ also opened in the mask 7 is not violated by the signal component $20_1$. With reference to FIG. 3B, the measurement functions $14_1$ and $14_n$ in FIG. 3E are executed within the application $2_2$. The pass range of the bandpass filter in the filter unit 11 is adjusted to the width of the violated mask 7. The signal component $20_1$ of the communications signal 20 mixed into the baseband and filtered is then transmitted to the measurement functions $14_1$ and $14_n$ of the application $2_2$. The start frequency and the end frequency of the individual ranges $22_1$ and $22_2$ which are opened in the mask 7 are not used to configure the pass range of the bandpass filter in the filter unit 11, but only to address the corresponding application $2_1, 2_2$ to $2_n$ and/or the corresponding measurement function $14_1, 14_2$ to $14_n$.

Furthermore, in the exemplary embodiment from FIG. 3E, two further masks $7_1, 7_3$ which overlap one another are violated. In this context, the mask $7_1$ is violated by the communications signal 20, or respectively by its noise. The mask $7_3$ is violated by the second signal component $20_2$ of the communications signal 20. In the further course, both the signal component $20_2$ of the communications signal 20 which violates the mask $7_3$ and also the component of the communications signal 20 which violates the mask $7_1$ could be filtered, mixed into the baseband and transmitted to the application $2_1$ or $2_n$. However, the application $2_1$ which is linked to the mask $7_1$ could not analyze the part of the communications signal 20 which violates the mask $7_1$, because this component relates exclusively to noise. For this reason, additional rules can be defined if several masks $7_1$, $7_3$ overlap. In this manner, it is possible to specify that, in the further course, exclusively the component of the communications signal 20 which violates the masks $7_1$, $7_3$ should be analyzed where a power peak of the communications signal 20 is highest, or where the average power of the communications signal 20 is highest, or where a priority of the allocated application $2_1$, $2_2$ to $2_n$ and/or measurement function $14_1$, $14_2$ to $14_n$ is highest.

In the exemplary embodiment from FIG. 3E, the power peak of the signal component $20_2$ within the mask $7_3$ is higher than the power peak in the mask $7_1$. Using this criterion, only the signal component $20_2$ would be correspondingly filtered, mixed into the baseband and transferred to the application $2_n$. Subject to the criterion according to which the component within an overlapping mask $7$, $7_1$, $7_2$, $7_3$ should be transmitted to the corresponding application $7$, $7_1$, $7_2$, $7_3$ where the average power of the communications signal 20 is highest, the signal component $20_2$, which violates the mask $7_3$ would also be correspondingly filtered mixed into the baseband and transferred to the application $2_n$. The average power is preferably calculated using a mean-value formation. However, the factual situation could appear different if the third criterion were adopted, according to which the priority of the application $2_1$, $2_2$ to $2_n$ linked to the respective mask $7$, $7_1$, $7_2$, $7_3$ would be decisive, as soon as it was determined that the priority of the application $2_1$ would exceed the priority of the application $2_n$. The factual situation just described applies not only for overlapping masks $7_1$, $7_3$ but also for overlapping ranges $22_1$, $22_2$, even if this has not been shown explicitly in the exemplary embodiment from FIG. 3E. Of course, the communications signal 20 can also be supplied to all applications $2_1$, $2_2$ to $2_n$ and/or measurement functions $14_1$, $14_2$ to $14_n$, for which the overlapping, violated masks $7$, $7_1$, $7_2$, $7_3$ and/or ranges $22_1$, $22_2$ have been buffered.

However, it is often the case that if, for example, a signal component $20_1$ violates an underlying mask 7, the cause for the violation can be found in another signal component $20_2$, which also violates a corresponding mask $7_3$. For example, in the initial example from FIG. 3E, in view of the fact that the second range $22_2$ of the mask 7 is violated by the first signal component $20_1$ of the communications signal 20, a measurement function $14_n$ within the application $2_2$ can be used, for example, to calculate the EVM. If an error is registered by the corresponding measurement function $14_n$ or the corresponding application $2_2$, or a high EVM value is calculated, the fact that a second signal component $20_2$ leaves a mask $7_3$ at the same time should also be stored. If the EVM value for the first signal component $20_1$ has been calculated, this can also be marked accordingly in such a case. For example, this can be implemented through a special color coding, so that, in the case of a subsequent evaluation, it is evident that several other masks $7$, $7_1$, $7_2$, $7_3$ were also violated at this time. In the case of a subsequent evaluation, the indication that the error may be attributable to another signal component $20_2$ which was active at the same time is accordingly not lost.

Figure 4:
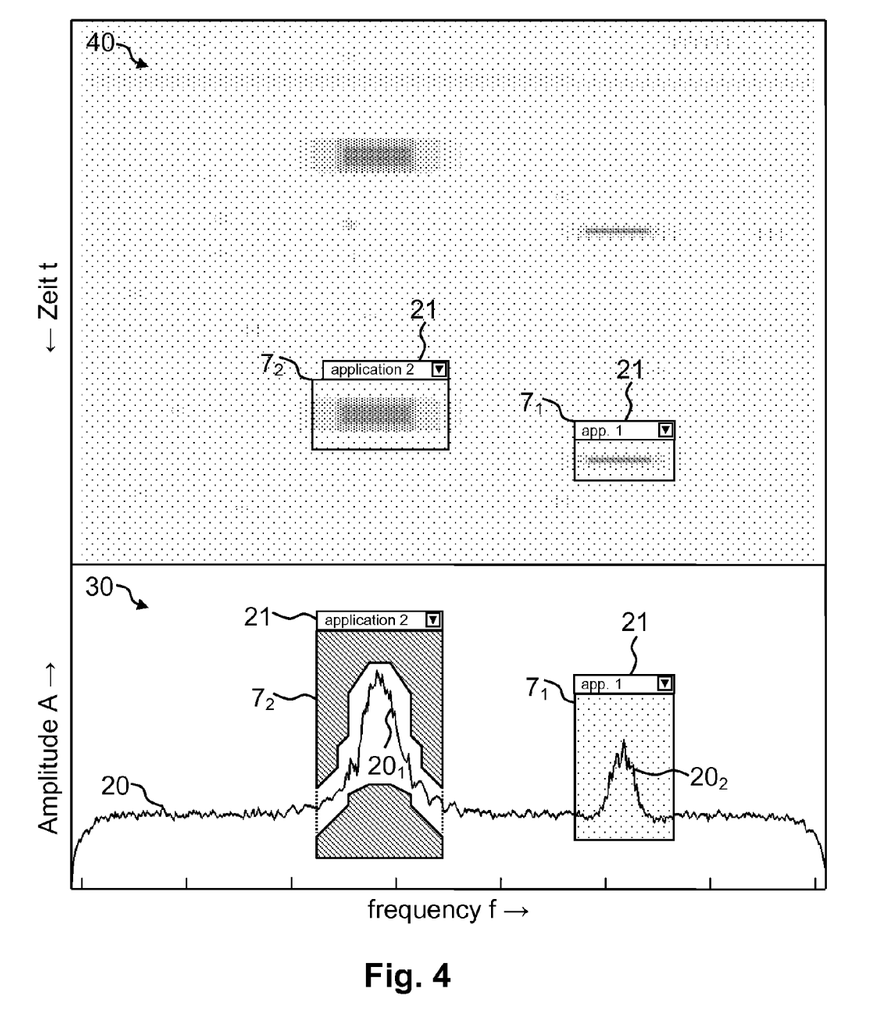
FIG. 4 a diagram that illustrates the display of various masks, both in the spectrum and also in the spectrogram, according to example embodiments of the invention.

FIG. 4 shows a diagram that illustrates the display of several masks $7_1$, $7_2$ both in the spectrum 30 and also in the spectrogram 40, according to example embodiments of the invention. By way of example, the spectrogram 40 and the spectrum 30 of the communications signal 20 are displayed one above the other. In the spectrogram 40, the time may also be displayed alongside the frequency, whereas the amplitude of the individual signal components is displayed through different colors and/or different hatching. Moreover, it is possible to indicate in the spectrogram 40 the duration for every mask $7_1$, $7_2$ which specifies the length of the time before and after the trigger impulse, in which the signal component $20_1$, $20_2$ of the communications signal 20 is also transferred to the corresponding application $2_1$, $2_2$ to $2_n$ and/or to the corresponding measurement function $14_1$, $14_2$ to $14_n$.

In the exemplary embodiment of FIG. 4, the signal component $20_1$ of the communications signal 20 is transmitted to the application $2_2$ for the mask $7_2$ for the duration of approximately 2 ms before the trigger impulse and the duration of approximately 5 ms after the trigger impulse.

If the spectrogram 40 is also displayed on a touch-sensitive screen unit 9, the duration and the frequency range can be adjusted in a particularly simple manner by means of a spreading function, for example, between the thumb and index finger. The spectrogram 40 preferably shows values from the ring buffer 4 which are reduced in number with regard to the resolution of the screen unit 9. It is additionally possible for the spectrogram 40 to display older values for the communications signal 20, which are no longer disposed in the ring buffer 4. In this case, the spectrogram 40 serves as a histogram which can draw the user's attention to exceptional events, so that the user can define an appropriate mask $7$, $7_1$, $7_2$, $7_3$ for the corresponding frequency range.

The control unit 6 can also automatically define masks $7$, $7_1$, $7_2$, $7_3$ which cover the components in the spectrum 30 in which an anomaly has been determined in the spectrogram 40. Such an anomaly can be seen, for example, in the exceeding of a given power level. As soon as the power level in this component of the spectrum 30 again exceeds a defined threshold value, the manually or automatically defined mask $7$, $7_1$, $7_2$, $7_3$ is violated and the corresponding signal component $20_1$, $20_2$ is supplied to the appropriate application $2_1$, $2_2$ to $2_n$ and/or measurement function $14_1$, $14_2$ to $14_n$.

Figure 5:
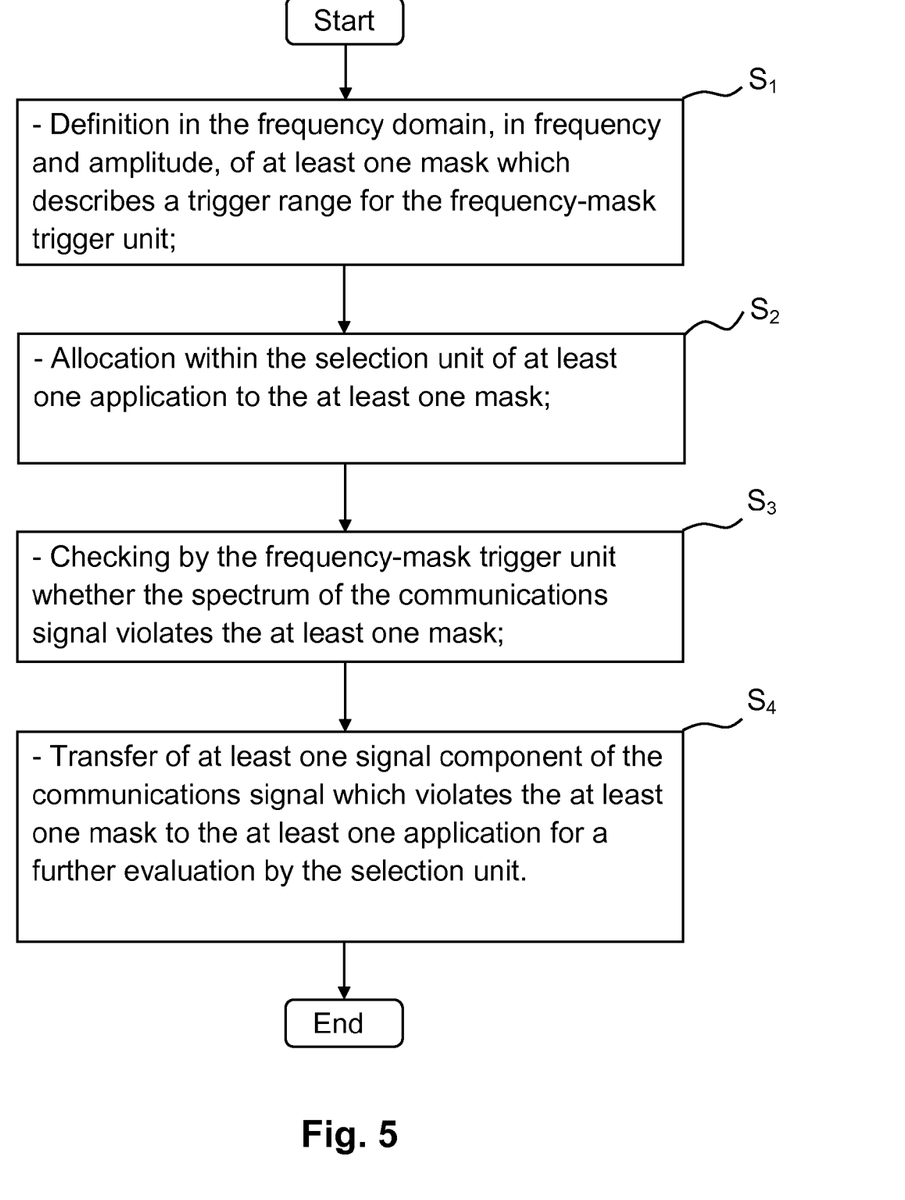
FIG. 5 a flow chart, which illustrates a method for transferring given signal components to different applications, according to example embodiments of the invention.

FIG. 5 shows a flow chart, which illustrates a method for transferring given signal components $20_1$, $20_2$ to different applications $2_1$, $2_2$ to $2_n$, according to example embodiments of the invention. In a first method step $S_1$, at least one mask $7$, $7_1$, $7_2$, $7_3$ which describes a trigger range for the frequency-mask trigger unit 5 is defined in the frequency domain. In this context, the mask $7$, $7_1$, $7_2$, $7_3$ is defined in frequency and amplitude. Such a definition can be implemented by loading already defined masks $7$, $7_1$, $7_2$, $7_3$, or new masks $7$, $7_1$, $7_2$, $7_3$ can be entered by means of the input unit 8.

Following this, method step $S_2$ is implemented. In method step $S_2$, at least one application $2_1$, $2_2$ to $2_n$ is allocated to the at least one mask $7$, $7_1$, $7_2$, $7_3$. Such an allocation is implemented by the control unit 6 within the selection unit 10.

In a next method step $S_3$, a check is carried out to determine whether the spectrum 30 of the communications signal 20 violates the at least one mask $7$, $7_1$, $7_2$, $7_3$. This is implemented by the frequency-mask trigger unit 5, which continuously transforms the communications signal 20 stored in the ring buffer 4 into the time domain and compares the amplitude of the individual frequency bins with the at least one previously defined mask $7$, $7_1$, $7_2$, $7_3$.

Following this, method step $S_4$ is implemented. In method step $S_4$, at least one signal component $20_1$ and $20_2$ of the communications signal 20 which violates the at least one mask $7$, $7_1$, $7_2$, $7_3$ is transferred to the at least one application $2_1$, $2_2$ to $2_n$ for a further evaluation. This transfer is implemented by the selection unit 10, which also controls the switch unit 13 which is responsible for the correct transfer of the at least one signal component $20_1$, $20_2$ of the communications signal 20 to the corresponding application $2_1$, $2_2$ to $2_n$.

Figure 6A:
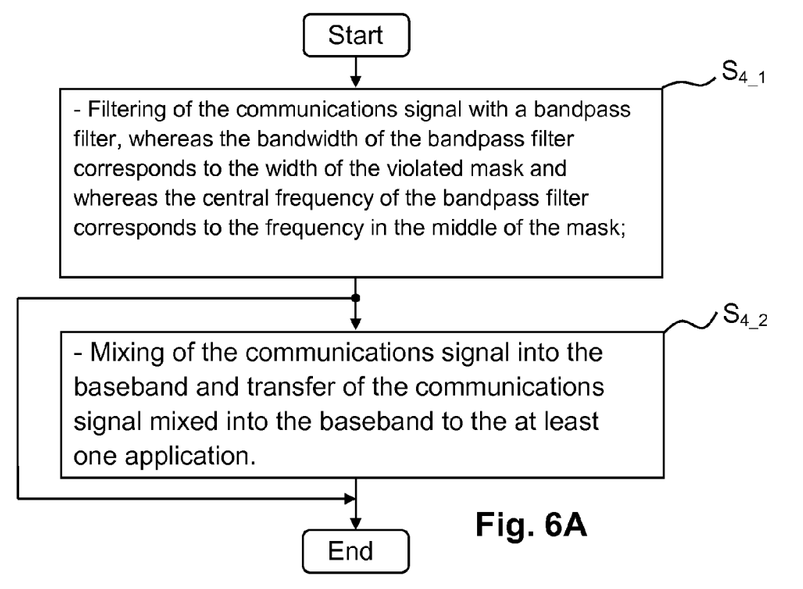
FIG. 6A a flow chart, which illustrates the filtering and mixing of a signal component within a mask according to example embodiments of the invention.

FIG. 6A shows a flow chart, which illustrates the filtering and mixing of a signal component $20_1$, $20_2$ in a mask $7, 7_1, 7_2, 7_3$ according to example embodiments of the invention. In the sub-method step $S_{4\_1}$, which can be implemented in the method step $S_4$, the at least one signal component $20_1$, $20_2$ of the communications signal 20 is filtered with a bandpass filter, whereas the bandwidth of the bandpass filter corresponds to the width of the violated mask $7, 7_1, 7_2, 7_3$ and whereas the central frequency of the bandpass filter corresponds to the frequency in the middle of the mask $7, 7_1, 7_2, 7_3$. Such a filtering may be optional, if the communications signal 20 provides only one signal component $20_1$ or $20_2$. However, if the communications signal 20 is a multi-standard radio signal, a filtering should be implemented.

Following this, the sub-method step $S_{4\_2}$ is implemented. In sub-method step $S_{4\_2}$, the at least one signal component $20_1$, $20_2$ of the communications signal 20 is mixed into the baseband, and the at least one signal component $20_1$, $20_2$ of the communications signal 20 mixed into the baseband is transferred to the at least one application $2_1$, $2_2$ to $2_n$. The mixing takes place in the mixer unit 12. The central frequency, which corresponds to the middle of the violated mask $7, 7_1, 7_2, 7_3$ is also transferred to the mixer unit 12.

Figure 6B:
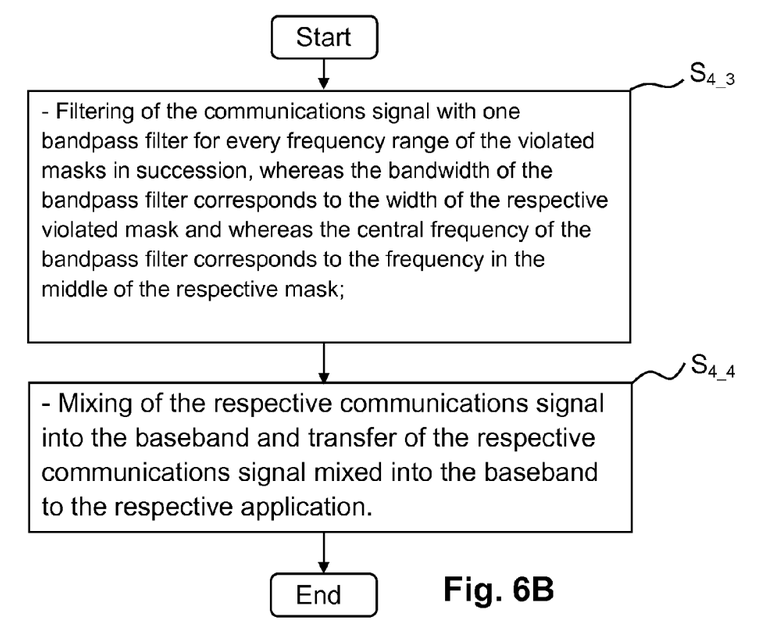
FIG. 6B a flow chart, which illustrates the filtering and mixing of several signal components in succession within several masks according to example embodiments of the invention.

FIG. 6B shows a flow chart, which illustrates the filtering and mixing of several signal components $20_1$, $20_2$ in succession in several masks $7, 7_1, 7_2, 7_3$ according to example embodiments of the invention. At the start, a method step $S_{4\_3}$ is implemented, which can be embodied within the method step $S_4$. In the sub-method step $S_{4\_3}$, the communications signal 20 is filtered for every frequency range of the violated masks $7, 7_1, 7_2, 7_3$ in succession, whereas the bandwidth of the bandpass filter corresponds to the width of the respective violated mask $7, 7_1, 7_2, 7_3$, and whereas the central frequency of the bandpass filter corresponds to the frequency in the middle of the respective mask $7, 7_1, 7_2, 7_3$. Sub-method step $S_{4\_3}$ is implemented instead of sub-method step $S_{4\_1}$ if several masks $7, 7_1, 7_2, 7_3$ are violated at the same time by the communications signal 20.

Following this, the sub-method step $S_{4\_4}$ is implemented. Sub-method step $S_{4\_4}$ is also implemented within method step $S_4$. In sub-method step $S_{4\_4}$, the respective signal component $20_1$, $20_2$ of the communications signal 20 is mixed into the baseband. Following this, each signal component $20_1$, $20_2$ of the communications signal 20 mixed into the baseband is transferred to the respective application $2_1$, $2_2$ to $2_n$. If several filter units 11 and several mixer unit 12 are provided in the device 1 according to the invention, the sub-method steps $S_{4\_3}$ and $S_{4\_4}$ can be implemented simultaneously for every signal component $20_1$, $20_2$.

Figure 7:
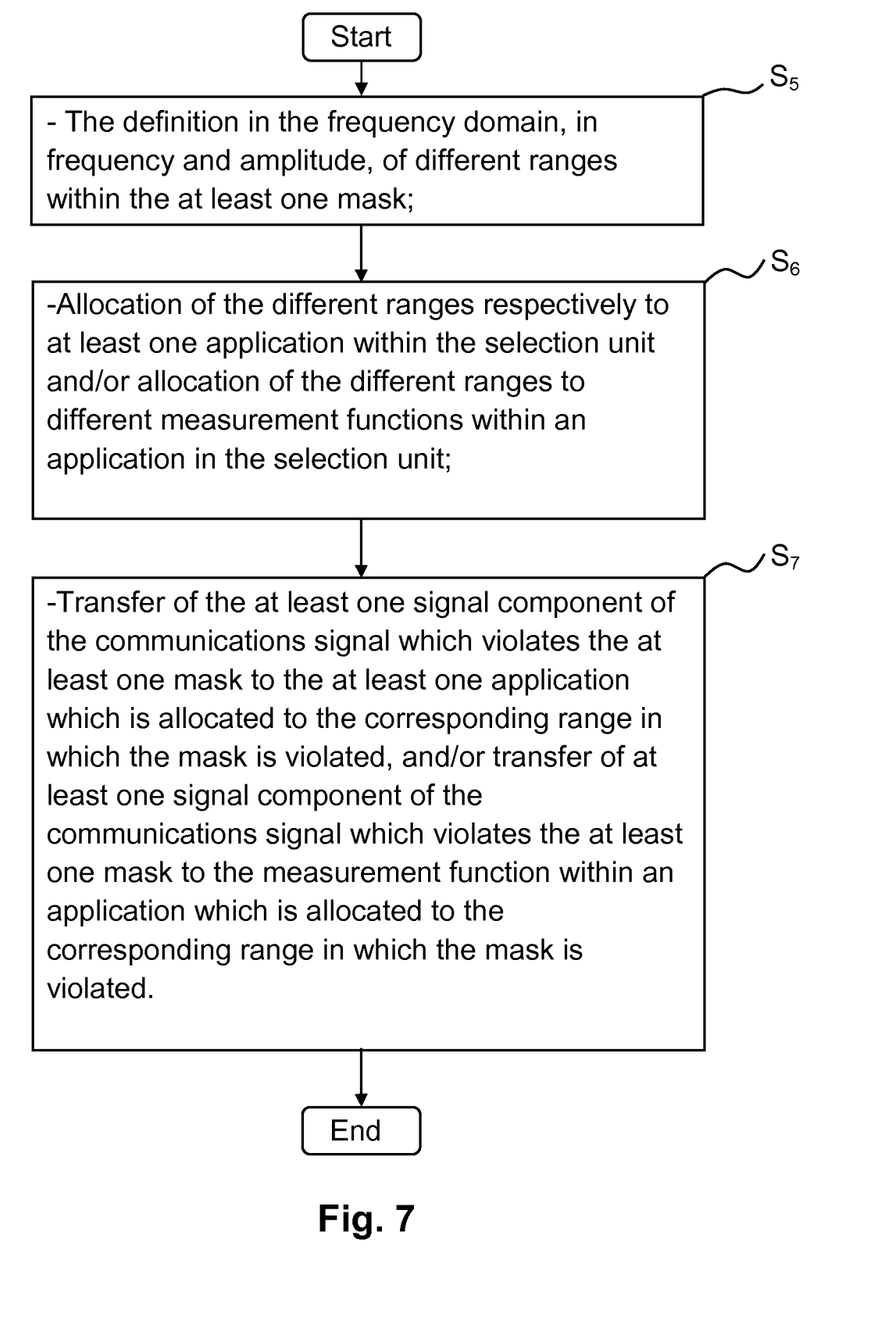
FIG. 7 a flow chart, which illustrates the definition of different ranges within a mask according to example embodiments of the invention.

FIG. 7 shows a flow chart, which illustrates the definition of different ranges $22_1$, $22_2$ within a mask $7, 7_1, 7_2, 7_3$ according to example embodiments of the invention. In method step $S_5$, which can be implemented within method step $S_1$, different ranges $22_1$, $22_2$ within the at least one mask $7, 7_1, 7_2, 7_3$ are defined in the frequency domain, in frequency and amplitude. In this context, it should be noted that the different ranges $22_1$, $22_2$ must not exceed the area of the underlying mask $7, 7_1, 7_2, 7_3$. The extension of the corresponding ranges $22_1$, $22_2$ should therefore be limited to the extension of the underlying mask $7, 7_1, 7_2, 7_3$.

Following this, the method step $S_6$ can be implemented. Method step $S_6$ can be implemented within method step $S_2$. In method step $S_6$, the different ranges $22_1$, $22_2$ are allocated respectively to at least one application $2_1$, $2_2$ to $2_n$. This is implemented by the control unit 6 within the selection unit 10. Furthermore, it is possible for the different ranges $22_1$, $22_2$ to be allocated to different measurement functions $14_1$, $14_2$ to $14_n$ within an application $2_1$, $2_2$ to $2_n$. This is also implemented by the control unit 6 within the selection unit 10.

Following this, method step $S_7$ is performed. Method step $S_7$ can be implemented within method step $S_4$. In method step $S_7$, the at least one signal component $20_1$, $20_2$ of the communications signal 20 which violates the at least one mask $7, 7_1, 7_2, 7_3$ is transferred to the at least one application $2_1$, $2_2$ to $2_n$, which is allocated to the corresponding frequency range in which the mask $7, 7_1, 7_2, 7_3$ is violated. Additionally or instead of this, the at least one signal component $20_1$, $20_2$ of the communications signal 20 which violates the at least one mask $7, 7_1, 7_2, 7_3$ can be transferred to the measurement function $14_1$, $14_2$ to $14_n$ within an application $2_1$, $2_2$ to $2_n$ which is allocated to the corresponding range $22_1$, $22_2$ in which the mask $7, 7_1, 7_2, 7_3$ is violated. This allows signal components $20_1$, $20_2$ to be analyzed dependent upon their signal shape by different applications $2_1$, $2_2$ to $2_n$ or by different measurement functions $14_1$, $14_2$ to $14_n$ within the applications $2_1$, $2_2$ to $2_n$. This approach saves calculation time, because it is not necessary to analyze every signal component $20_1$, $20_2$ with all of the methods and processes available. This allows the communications signal 20, which is continuously digitized by the analog-digital converter 3 and stored in the ring buffer unit 4, to be analyzed in real-time.

Figure 8:
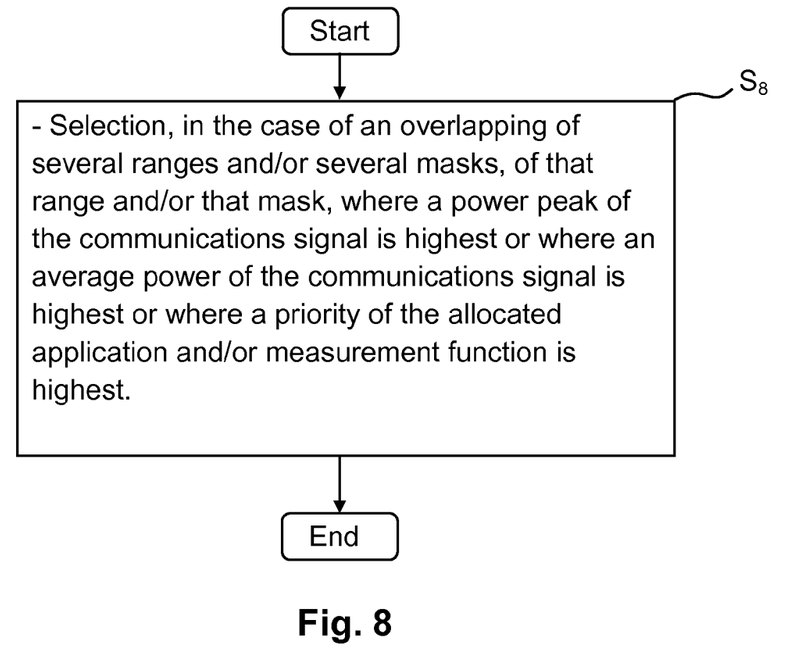
FIG. 8 a flow chart, which illustrates the transmission of certain signal components to the corresponding applications and/or measurement functions within the applications in the case of overlapping ranges and/or masks, according to example embodiments of the invention.

FIG. 8 shows a flow chart, which illustrates the transmission of certain signal components $20_1$, $20_2$, to the corresponding applications $2_1$, $2_2$ to $2_n$ and/or measurement functions $14_1$, $14_2$ to $14_n$ within the applications $2_1$, $2_2$ to $2_n$, in the case of overlapping ranges $22_1$, $22_2$ and/or masks $7, 7_1, 7_2, 7_3$, according to example embodiments of the invention. For this purpose, method step $S_8$, which can be implemented within method step $S_4$ or within method step $S_7$ is performed. In method step $S_8$, in the case of an overlapping of several ranges $22_1$, $22_2$ and/or several masks $7, 7_1, 7_2, 7_3$, the range $22_1$, $22_2$ and/or the mask $7, 7_1, 7_2, 7_3$ is selected where a power peak of the communications signal 20 is highest, or where an average power of the communications signal 20 is highest, or where a priority of the allocated application $2_1$, $2_2$ to $2_n$ and/or measurement function $14_1$, $14_2$ to $14_n$ is highest. As soon as the corresponding selection has been performed, the bandpass filter in the filter unit 11 is adjusted to the width of the violated mask $7, 7_1, 7_2, 7_3$, and the corresponding signal component $20_1$, $20_2$ of the communications signal 20 is filtered, and this is then mixed into the baseband in a mixer unit 12 and transferred to the corresponding application $2_1$, $2_2$ to $2_n$ and/or measurement function $14_1$, $14_2$ to $14_n$.

Figure 9:
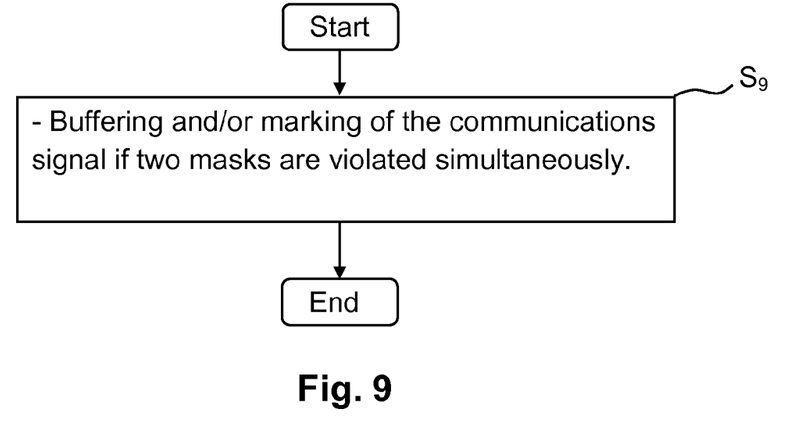
FIG. 9 a flow chart, which illustrates the operation of a method or device in the event of a simultaneous violation of several masks and/or ranges, according to example embodiments of the invention.

FIG. 9 shows a flow chart, which illustrates the operation of a method or device in the event of a simultaneous violation of several masks $7, 7_1, 7_2, 7_3$ and/or ranges $22_1$, $22_2$, according to example embodiments of the invention. For this purpose, method step $S_9$ is performed. Method step $S_9$ is preferably performed after method step $S_4$. Within method step $S_9$, if several masks $7, 7_1, 7_2, 7_3$ are violated at the same time, all occurring signal components $20_1$, $20_2$ of the communications signal 20 are buffered and/or marked when the evaluation of the at least one signal component $20_1$, $20_2$ by at least one application $2_1$, $2_2$ to $2_n$ and/or at least one measurement function $14_1$, $14_2$ to $14_n$ suggests an error. In the case of a violation of a mask $7, 7_1, 7_2, 7_3$ and the subsequent detection of an error, for example, an excessively high EVM value or an inadequate CCDF value, this method step makes it possible to ascertain that further masks $7, 7_1, 7_2, 7_3$ were violated at this time. Accordingly, it can be established later whether the occurrence of an error within one signal component $20_1$, $20_2$ is possibly associated with the simultaneous occurrence of another signal component $20_1$, $20_2$.

Within the scope of the invention, all of the features described and/or illustrated can be combined with one another as required. In particular, the dependent claims relating to the method can also be combined with the device claims relating to the device 1 and vice versa.

What is claimed is:

1. A method for analyzing a communications signal, comprising the following method steps:
    defining at least one mask in the frequency domain, in frequency and amplitude, which specifies a trigger range for a frequency-mask trigger device, wherein each mask covers a frequency range of a specific communications standard;
    allocating at least one application to each mask, wherein the at least one application allocated to each mask implements measurements according to the respective communications standard;
    determining, by the frequency-mask trigger device, whether the spectrum of the communications signal violates the at least one mask, wherein the communications signal comprises a multi-standard communications signal;
    filtering the communications signal that violates the at least one mask, for each violated mask, via a corresponding bandpass filter to generate a corresponding signal component of the communications signal, wherein a bandwidth of the corresponding bandpass filter corresponds to a width of the violated mask, and wherein a central frequency of the corresponding bandpass filter corresponds to a frequency in the middle of the violated mask;
    transmitting each signal component to each application allocated to the corresponding violated mask for evaluation.

2. The method according to claim 1, further comprising: mixing each signal component into baseband.

3. The method according to claim 1, further comprising:
    filtering the communications signal via a bandpass filter for every frequency range of the violated masks, wherein the bandwidth of the bandpass filter corresponds to a width of the respective violated mask, and wherein the central frequency of the bandpass filter corresponds to a frequency in the middle of the respective mask; and
    mixing a respective signal component of the communications signal into baseband and transmitting the respective signal component mixed into the baseband to the respective application.

4. The method according to claim 1, further comprising:
    defining a plurality of ranges within the at least one mask in the frequency domain, in frequency and amplitude;
    allocating the ranges respectively to one or more of the at least one application and at least one measurement function within at least one of the at least one application; and
    transmitting the at least one signal component of the communications signal which violates the at least one mask to one or more of the at least one application, which is allocated to the corresponding range in which the mask is violated, and the at least one measurement function within the at least one of the at least one application, which is allocated to the corresponding range in which the mask is violated.

5. The method according to claim 4, further comprising:
    selecting, in the case of an overlapping of several ranges and/or several masks, a range and/or a mask wherein a power peak of the communications signal is highest, an average power of the communications signal is highest, or a priority of the allocated application and/or measurement function is highest.

6. The method according to claim 1, further comprising:
    storing and/or marking each signal component of the communications signal that has been determined as violating a mask when the evaluation of the at least one signal component by the at least one application reveals an error.

7. The method according to claim 1, wherein:
    the at least one mask represents an area in the spectrum, and is violated where at least one measured value of the communications signal is disposed within the area in the spectrum; and/or
    the communications signal is a multi-standard radio signal; and/or
    different masks over different frequency ranges for different communications standards; and/or
    different applications implement different measurements for various communications standards; and/or
    an application determines an error vector magnitude (EVM) of at least one communications standard in the case of a violated mask, and, in the case of a high value of the EVM, further masks that are additionally violated are stored; and/or
    sampled values for the communications signal are stored continuously in a ring buffer; and/or
    the communications signal is displayed in a spectrogram.

8. A device for analyzing a communications signal comprising:
    a frequency-mask trigger device;
    a selection device;
    a control device;
    a filter device; and
    a transmitter device; and
    wherein the control device is configured to define at least one mask that specifies a trigger range for the frequency-mask trigger device defined in the frequency domain, in frequency and amplitude, wherein each mask covers a frequency range of a specific communications standard; and
    wherein the selection device is configured to allocate at least one application to each mask, wherein the at least one application allocated to each mask implements measurements according to the respective communications standard; and
    wherein the frequency-mask trigger device is configured to determine whether the spectrum of the communications signal violates the at least one mask, wherein the communications signal comprises a multi-standard communications signal; and
    wherein the filter device is configured to filter the communications signal that violates the at least one mask, for each violated mask, via a corresponding bandpass filter to generate a corresponding signal component of the communications signal, wherein a bandwidth of the corresponding bandpass filter corresponds to a width of the violated mask, and wherein a central frequency of the corresponding bandpass filter corresponds to a frequency in the middle of the violated mask; and
    wherein the transmitter device is configured to transmit each signal component to each application allocated to the corresponding violated mask for evaluation.

9. The device according to claim 8, further comprising one or more fo the following components:
    a mixer device configured to mix each signal component into baseband.

10. The device according to claim 8, further comprising one or more fo the following components:

a filter device configured to filter each frequency range of the violated masks via a bandpass filter, wherein the bandwidth of each bandpass filter corresponds to a width of the respective violated mask, and wherein the central frequency of each bandpass filter corresponds to a frequency in the middle of the respective mask; and a mixer device configured to mix a respective signal component of the communications signal into baseband, wherein the respective signal components of the communications signal mixed into the baseband are transmitted to the respective application.

11. The device according to claim 8, wherein:

the control device is configured to define a plurality of ranges within the at least one mask in the frequency domain, in frequency and amplitude, the selection device is configured to allocate the ranges respectively to one or more of the at least one application and at least one measurement function within at least one of the at least one application, the control unit is configured to transmit the at least one signal component of the communications signal which violates the at least one mask to one or more of the at least one application, which is allocated to the corresponding range in which the mask is violated, and the at least one measurement function within the at least one of the at least one application, which is allocated to the corresponding range in which the mask is violated.

12. The device according to claim 11, wherein in the case of an overlapping of several regions and/or several masks, the selection unit is configured to select a range and/or a mask wherein a power peak of the communications signal is highest, an average power of the communications signal is highest, or a priority of the allocated application and/or measurement function is highest.

13. The device according to claim 8, wherein the control unit is configured to store and/or mark each signal component of the communications signal that has been determined as violating a mask when the evaluation of the at least one signal component by the at least one application reveals an error.

14. The device according to claim 8, wherein:

the at least one mask represents an area in the spectrum, and s violated where at least one measured value of the communications signal is disposed within the area in the spectrum; and/or the communications signal is a multi-standard radio signal; and/or different masks cover different frequency ranges for different communications standards; and/or different applications implement different measurements for various communications standards; and/or an application determines an error vector magnitude (EVM) of at least one communications standard in the case of a violated mask, and, in the case of a high value of the EVM, further masks that are additionally violated are stored; and/or sampled values for the communications signal are stored continuously in a ring buffer; and/or the communications signal is displayed in a spectrogram.

15. A non-transitory computer-readable storage medium carrying one or more sequences of one or more instructions which, when executed by one or more processors, cause an apparatus to at least perform the following steps:

defining at least one mask in the frequency domain, in frequency and amplitude, which specifies a trigger range for a frequency-mask trigger device, wherein each mask covers a frequency range of a specific communications standard;

allocating at least one application to each mask, wherein the at least one application allocated to each mask implements measurements according to the respective communications standard;

determining, by the frequency-mask trigger device, whether the spectrum of the communications signal violates the at least one mask, wherein the communications signal comprises a multi-standard communications signal;

filtering the communications signal that violates the at least one mask, for each violated mask, via a corresponding bandpass filter to generate a corresponding signal component of the communications signal, wherein a bandwidth of the corresponding bandpass filter corresponds to a width of the violated mask, and wherein a central frequency of the corresponding bandpass filter corresponds to a frequency in the middle of the violated mask;

transmitting each signal component to each application allocated to the corresponding violated mask for evaluation.

16. The non-transitory computer-readable storage medium according to claim 15, wherein the apparatus is caused to further perform:

mixing each signal component into baseband.

17. The non-transitory computer-readable storage medium according to claim 15, wherein the apparatus is caused to further perform:

filtering the communications signal via a bandpass filter for every frequency range of the violated masks, wherein the bandwidth of the bandpass filter corresponds to a width of the respective violated mask, and wherein the central frequency of the bandpass filter corresponds to a frequency in the middle of the respective mask; and mixing a respective signal component of the communications signal into baseband and transmitting the respective signal component mixed into the baseband to the respective application.

18. The non-transitory computer-readable storage medium according to claim 15, wherein the apparatus is caused to further perform:

defining a plurality of ranges within the at least one mask in the frequency domain, in frequency and amplitude;

allocating the ranges respectively to one or more of the at least one application and at least one measurement function within at least one of the at least one application; and transmitting the at least one signal component of the communications signal which violates the at least one mask to one or more of the at least one application, which is allocated to the corresponding range in which the mask is violated, and the at least one measurement function within the at least one of the at least one application, which is allocated to the corresponding range in which the mask is violated.

19. The non-transitory computer-readable storage medium according to claim 18, wherein the apparatus is caused to further perform:

selecting, in the case of an overlapping of several ranges and/or several masks, a range and/or a mask wherein a power peak of the communications signal is highest, an average power of the communications signal is highest, or a priority of the allocated application and/or measurement function is highest.

20. The non-transitory computer-readable storage medium according to claim 15, wherein the apparatus is caused to further perform:

storing and/or marking each signal component of the communications signal that has been determined as violating a mask when the evaluation of the at least one signal component by the at least one application reveals an error.

21. The non-transitory computer-readable storage medium according to claim 15, wherein:
the at least one mask represents an area in the spectrum, and a mask is violated where at least one measured value of the communications signal is disposed within the area in the spectrum; and/or
the communications signal is a multi-standard radio signal; and/or
different masks cover different frequency ranges for different communications standards; and/or
different applications implement different measurements for various communications standards; and/or
an application determines an error vector magnitude (EVM) of at least one communications standard in the case of a violated mask, and, in the case of a high value of the EVM, further masks that are additionally violated are stored; and/or
sampled values for the communications signal are stored continuously in a ring buffer; and/or
the communications signal is displayed in a spectrogram.

* * * * *